United States Patent
Mechnig et al.

(10) Patent No.: US 7,982,540 B2
(45) Date of Patent: Jul. 19, 2011

(54) INTEGRATED CIRCUIT ARRANGEMENT FOR GENERATING A DIGITAL VARIABLE GAIN CONTROL SIGNAL

(75) Inventors: Stephan Mechnig, Munich (DE); Vittorio Melini, Munich (DE)

(73) Assignee: National Semiconductor Germany AG, Unterhaching (DE)

( * ) Notice: Subject to any disclaimer, the term of this patent is extended or adjusted under 35 U.S.C. 154(b) by 164 days.

(21) Appl. No.: 12/324,488

(22) Filed: Nov. 26, 2008

(65) Prior Publication Data

US 2009/0289718 A1     Nov. 26, 2009

(30) Foreign Application Priority Data

Nov. 28, 2007   (DE) .................. 10 2007 057 282

(51) Int. Cl.
*H03G 3/30* (2006.01)
(52) U.S. Cl. ........................... 330/279; 330/307
(58) Field of Classification Search .................. 330/129, 330/141, 278, 279, 281, 307; 455/127.2, 455/232.1, 234.1, 245.1
See application file for complete search history.

(56) References Cited

U.S. PATENT DOCUMENTS

| 4,675,854 | A |   | 6/1987  | Lau |
| 5,561,395 | A | * | 10/1996 | Melton et al. ............ 330/279 |
| 7,423,482 | B2 |  | 9/2008  | Blon |
| 7,463,872 | B2 | * | 12/2008 | Jin et al. ............... 455/245.1 |
| 2007/0075768 | A1 |  | 4/2007 | Blon |
| 2008/0204143 | A1 | * | 8/2008 | Montemayor et al. ..... 330/278 |

FOREIGN PATENT DOCUMENTS

| DE |        3339984 A1 | 5/1985 |
| DE | 102005047172 A1 | 4/2007 |

\* cited by examiner

*Primary Examiner* — Khanh V Nguyen
(74) *Attorney, Agent, or Firm* — Pearne & Gordon LLP

(57) ABSTRACT

The invention proposes an integrated circuit arrangement (10) for generating a digital variable gain control signal (SA) for a digitally variable gain amplifier (14), comprising: a memory (16) for storing at least one digital signal sequence (DS) defining a time gain profile, a controller (18) for generating the digital variable gain control signal (SA) by reading out the memory (16), and a programming interface (20) for programming the memory (16). The integrated circuit arrangement (10) in accordance with the invention makes it possible to read out e.g. a gain characteristic as needed at the time for an ultrasound or radar application of a VGA in fast response at a defined rate from the memory (16).

9 Claims, 4 Drawing Sheets

| Data Bits [7:0] *Decimal value* | divider | F$_{\text{Intclk}}$(@40Mhz) | Period (us) |
|---|---|---|---|
| 0 | 1 | 40.000 | 0.025 |
| 1 | 2 | 20.000 | 0.050 |
| 2 | 3 | 13.333 | 0.075 |
| 3 | 4 | 10.000 | 0.100 |
| 4 | 5 | 8.000 | 0.125 |
| 5 | 6 | 6.667 | 0.150 |
| 6 | 7 | 5.714 | 0.175 |
| 7 | 8 | 5.000 | 0.200 |
| 8 | 9 | 4.444 | 0.225 |
| 9 | 10 | 4.000 | 0.250 |
| 10 | 11 | 3.636 | 0.275 |
| 11 | 12 | 3.333 | 0.300 |
| 12 | 13 | 3.037 | 0.325 |
| 13 | 14 | 2.857 | 0.350 |
| 14 | 15 | 2.667 | 0.375 |
| 15 | 16 | 2.500 | 0.400 |
| 16 | 17 | 2.353 | 0.425 |
| 17 | 18 | 2.222 | 0.450 |
| 18 | 19 | 2.105 | 0.475 |
| 19 | 20 | 2.000 | 0.500 |
| .... | .... | | |
| 39 | 40 | 1.000 | 1.000 |
| .... | .... | | |
| 253 | 254 | 0.157 | 6.350 |
| 254 | 255 | 0.157 | 6.375 |
| 255 | 256 | 0.156 | 6.400 |

Fig. 4

INTEGRATED CIRCUIT ARRANGEMENT FOR GENERATING A DIGITAL VARIABLE GAIN CONTROL SIGNAL

BACKGROUND OF THE INVENTION

1. Field of the Invention

The present invention relates to an integrated circuit arrangement for generating a digital variable gain control signal for a digitally variable gain amplifier.

2. Description of the Prior Art

A digitally variable gain amplifier (VGA) is known from German patent application DE 10 2005 047 172 A1. This known VGA serves to amplify an analog input signal and to output the amplified input signal as an output signal. The gain, in other words the ratio of the output signal to the input signal, in this arrangement can be continually varied. For this purpose the VGA is input a digital variable gain control signal as may be generated e.g. by a digital data processing means such as e.g. a microcontroller. This publication discloses no details as to how the variable gain control signal is generated.

SUMMARY OF THE INVENTION

An object of the present invention is to define a way of generating a digital variable gain control signal for a VGA as best universally possible.

This object is achieved in accordance with the invention by an integrated circuit arrangement comprising:

- a memory for storing at least one digital signal sequence defining a time gain profile
- a controller for generating the digital variable gain control signal by reading out the memory, and
- a digital programming interface for programming the memory.

This now makes it possible to advantage by simple ways and means to generate the variable gain control signal by reading out a memory. In many applications such as e.g. in ultrasound medical instrumentation or in radar applications e.g. in automotive engineering a variable gain characteristic (gain as a function of time) of a preamplifier for amplifying a detection signal is needed. The invention now makes it possible to read out a gain characteristic from the memory as required at any one time. Programming and reprogramming the circuit arrangement is possible via the integrated digital programming interface to thus render the circuit arrangement practically universally compatible.

"Programming the memory" is intended to mean that the stored content of the memory, in other words at least a digital signal sequence can be varied as desired (i.e. not "fixedly programmed or hard-wired").

In one particularly preferred embodiment it is provided for that the controller too is programmable, meaning that the response or function of the controller is not fixedly programmed but likewise variable. For this, it may be provided for that the programming interface, featured in any case, is also configured or used for programming the controller.

The term "function or response, respectively, of the controller" covers especially two aspects highly essential to actual practice: for one thing, by means of a certain response is can be defined at which point reading out is commenced in a memory and how in the course of reading out the subsequent memory locations to be read out are determined. For another, by defining a certain response the rate at which the memory is read out can be defined to generate the digital variable gain control signal, i.e. with a programmable memory these and, where necessary, further details of the response can now be comfortably defined or set.

In another further aspect it is provided for that the controller works by making use of control parameters stored in a storage area of the memory. Using this aspect as is easy to achieve in practice now makes it possible to make additional use of the programming interface as aforementioned also for programming the controller.

In another embodiment it is provided for that the memory comprises a first memory portion (e.g. module) for storing at least one digital signal sequence and at least one second memory portion (e.g. module) for storing control parameters of the controller and/or of the programming interface. Dividing the memory into a first memory portion and a second memory portions (e.g. memory modules) has the advantage in practice that reading out control parameters or varying the control parameters, especially in applications having a critical time factor, is of no detriment to reading out a digital control sequence. While still reading out a digital control sequence from the first memory portion, for instance, reprogramming the control parameters to be saved in the second memory portion can already be done in serving to define the response of the controller and/or of the programming interface.

As aforementioned, providing memorized and preferably reprogrammable control parameters now makes it possible to vary the response of the controller to advantage. As compared to this, "control parameters of the programming interface" are intended to be the parameters which tweak the response of the programming interface.

Being able to tweak the response of the programming interface permits enhancing programming efficiency. More particularly a kind of language or protocol can be provided for programming the data entered externally of the programming interface. In this arrangement, updating the setting of the control parameters of the programming interface defines how subsequent programming data is to be handled. For example, the subsequent data may involve a digital signal sequence to be saved in a certain memory area. But this may also involve e.g. data provided for updating a newly stored control parameter (for the controller or programming interface). Defining the response of the controller and programming interface by control parameters which can be stored and optionally varied, which in turn can be reprogrammed by means of the programming interface, makes for adapting the circuit arrangement with optimum flexibility and efficiency, be it adapting it to a certain amplifier application or adapting it in the course of amplifier operation.

In another embodiment it is provided for that the memory comprises a memory area logically dividable into a plurality of banks for storing a plurality of digital signal sequences.

The details of such a logically dividable configuration, in other words e.g. the number of memory banks as well as the physical start and end of each memory bank are preferably programmable. For this purpose e.g. control parameters of the kind as explained aforementioned can be used which in this case define such details.

In addition to one or more control parameters for logically dividing the memory into memory banks expediently employed for memorizing a gain characteristic a control parameter may be provided e.g. which defines the frequency at which the memory is read out. When the memory is logically divided into a plurality of memory banks the reading out frequency can be preferably defined separately for each and every memory bank by a corresponding control parameter.

In another embodiment it is provided for that the circuit arrangement comprises a clock generator for generating a timing (clock) signal or an input for entering a timing (clock) signal used by the controller to generate the digital variable gain control signal by reading out the memory. This timing signal thus defines the rate at which reading out is done. In another further embodiment it is provided for that the circuit arrangement comprises furthermore, e.g. as part of the aforementioned clock generator a variable frequency divider adjustable by means of the controller to divide the frequency of the aforementioned timing signal before it being used. The "divider" (number by which the original frequency of the timing signal is divided) may be in this arrangement a control parameter of the kind as described aforementioned.

Originally, varying the gain of a digitally variable gain amplifier (VGA) is possible only in steps in accordance with the entered digital values. But in a special configuration of the VGA, respectively of the circuit arrangement used for generating the signal for varying the gain it is ultimately also possible to continuously vary the gain by "smearing" the time profile of the steps as defined by the original digital variable gain control signal. Rendering such a gain characteristic continuous is explained, for example, in the aforementioned document DE 10 2005 047 172 A1 based on using integration stages via which the variable gain control signal is handled. Using such integration stages (e.g. integrators) now makes it possible that even a sudden change in the digital variable gain control signal does not result in a likewise sudden change in the gain but instead in a more smooth change.

In another preferred embodiment of the present invention the generated variable gain control signal contains a signal component which defines to what extent quantitatively the gain of the VGA is equalized after sudden jumps in varying the gain.

This quantitative extent to which the gain is equalized may be e.g. a time constant characterizing an integration stage of the aforementioned kind. In the scope of the present invention instead of one such time constant any general kind of quantitative measure can be provided, needing to be all the larger the longer it takes until the gain as actually resulting follows a sudden jump in the digital variable gain control signal.

In another preferred embodiment the circuit arrangement comprises a trigger input directly connected to the controller serving to input a trigger signal as the basis for triggering reading out of the memory to generate the digital variable gain control signal as is particularly a major advantage in applications having a critical time factor.

In yet another advantageous embodiment the memory, controller and programming interface are interlinked by a bus system. More particularly the memory may be linked to the controller by at least one bus, the controller in turn being linked by at least one bus to the programming interface. In a special embodiment the programming interface is linked by at least one bus to a memory serving to store control parameters of the programming interface and/or of the controller.

The circuit arrangement may be fabricated for example in CMOS technology and may comprise, in addition to the components needed to generate the digital variable gain control signal further function blocks, it being just as conceivable that the VGA constitutes a function block of the circuit arrangement.

One preferred use of the circuit arrangement and respectively of the amplifier system formed thereby is signal conditioning (e.g. Preamplification) in a detection method as is particularly of interest when the signals being detected are based on analog reception signals whose amplitude varies in time because of the system involved. This includes e.g. ultrasound and radar applications in which the received signal is damped in being communicated.

BRIEF DESCRIPTION OF THE DRAWINGS

The invention will now be detained by way of example embodiments with reference to the drawings in which FIG. 4 is a Table illustrating how a variable frequency gain control signal is generated.

DESCRIPTION OF THE PREFERRED EMBODIMENT(S)

Figure 1:
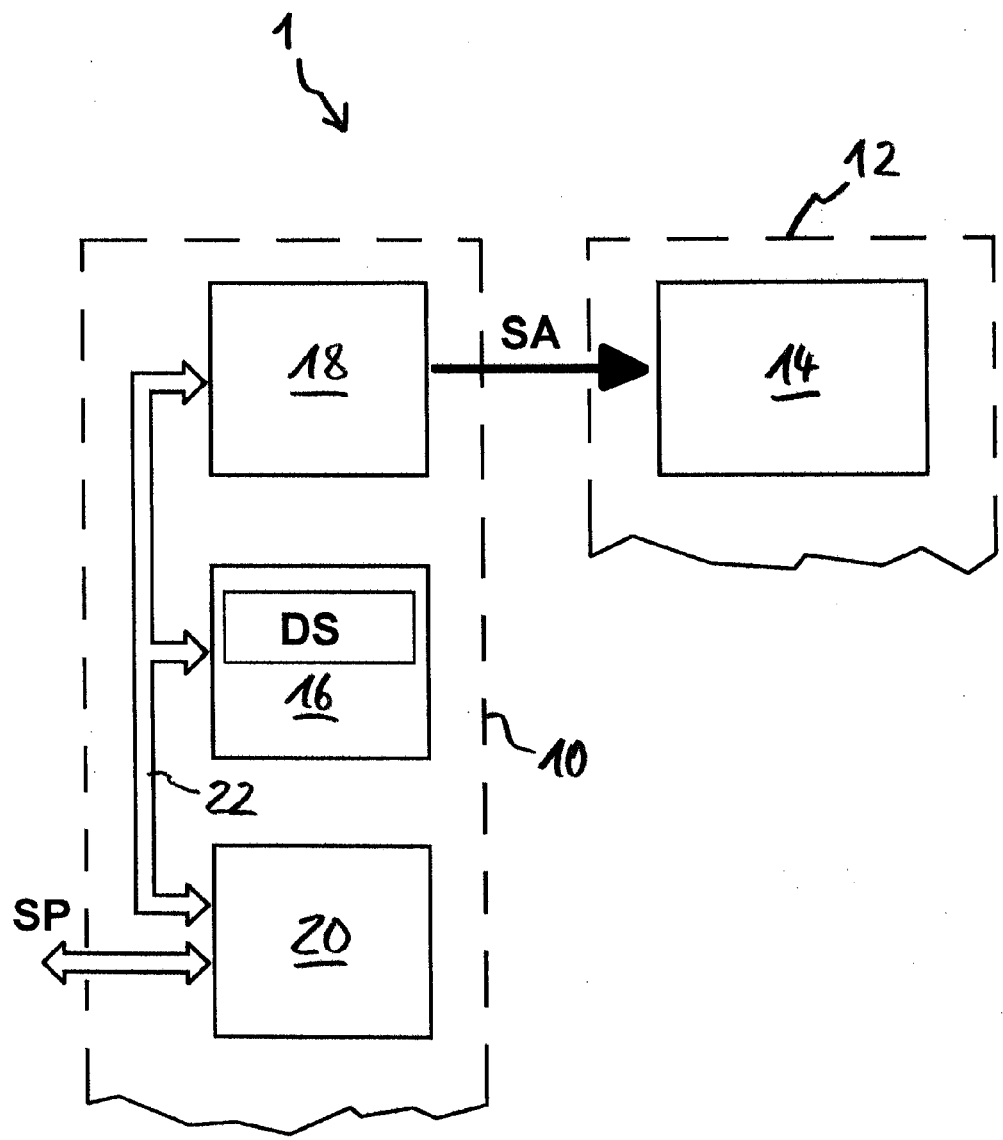
FIG. 1 is a block circuit diagram of an amplifier system comprising a circuit arrangement for generating a digital variable gain control signal in accordance with a first example embodiment.

Referring now to FIG. 1 there is illustrated an amplifier system 1 comprising an integrated circuit arrangement 10 fabricated in CMOS technology and provided separately therefrom in this embodiment an amplifier module 12 containing a digitally variable gain amplifier (VGA) 14. As an alternative to this example embodiment as shown the amplifier could also be configured as a component of the integrated circuit arrangement 10.

The integrated circuit arrangement 10 serves to generate a digital variable gain control signal SA for the VGA 14 and comprises a memory 16 for storing at least one digital signal sequence DS defining a time gain profile, a controller 18 for generating the digital variable gain control signal SA by reading out the memory 16, and a programming interface 20 for programming the memory 16 by inputting a programming signal SP.

The components 16, 18 and 20 of the integrated circuit arrangement 10 are interconnected by a bus system 22.

In the example embodiment as shown the amplifier module 12 serves to preamplify a detection signal from an ultrasound detector of a medical apparatus. In this case, the same as in comparable radar applications, a variable gain characteristic (as a function of time) of the preamplifier (VGA 14) is required. The gain of the VGA 14 in operation is defined in accordance with the time variable digital gain control signal SA.

Defining the variable gain control signal SA as a function of time is realized by simple ways and means, namely by the integrated circuit arrangement 10 the digital signal sequence DS is read out clocked from the memory 16 by the programming signal SP containing the individual programming instructions and data as pre-programmed. Readout is controlled by the controller 18. In the simplest case the variable gain control signal SA generated by the controller 18 precisely corresponds to the digital signal sequence DS as read out with a certain clock frequency.

By means of the programming interface 20 the memory 16 can be programmed/re-programmed, for example by saving further digital signal sequences in the memory or by varying previously saved digital signal sequences.

In the following description of a further example embodiment like components are identified by like reference numerals but each supplemented by a small letter "a" to distinguish them from those of the already described example embodiment. The following description details substantially only the differences as compared to the example embodiment already described to which otherwise express reference is made.

Figure 2:
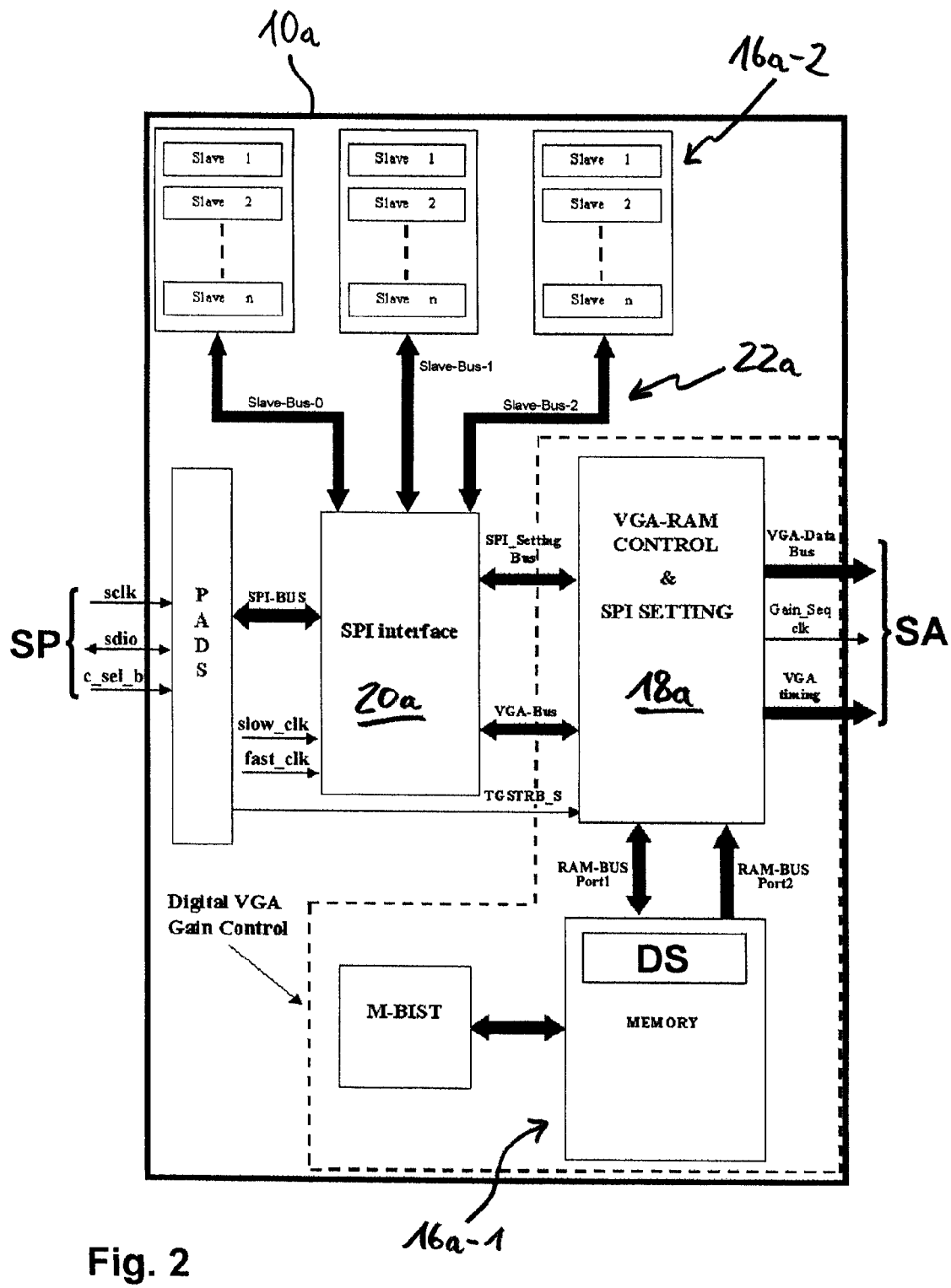
FIG. 2 is a block circuit diagram of a circuit arrangement in accordance with a further example embodiment.

Referring now to FIG. 2 there is illustrated a further example embodiment of a circuit arrangement 10a for generating a digital variable gain control signal SA for a VGA (not shown).

The circuit arrangement 10a comprises a memory 16a which in this example embodiment is physically formed by a first memory module 16a-1 (RAM) for storing at least one digital signal sequence DS and three second memory modules (each containing a plurality of registers) and identified in all as 16a-2.

The same as in the embodiment described with reference to FIG. 1 there is provided furthermore a controller 18a for generating the digital variable gain control signal SA and a digital programming interface 20a.

As shown in FIG. 2 the programming interface 20a communicates on the one hand via three bus links with the second memory module memory 16a-2 and via two bus links with the controller 18a. The controller 18a communicates with the first memory module 16a-1 with via two bus links. As shown, the programming signal SP comprises a plurality of signal components as can be entered via an interface bus system, the variable gain control signal SA output via the integrated circuit arrangement 10 to the VGA likewise comprising a plurality of signal components in the example as shown.

By means of the programming signal SP not only at least one digital signal sequence DS serving as the basis for generating the variable gain control signal SA can be programmed/reprogrammed in the memory module 16a-1 but also the mode of operation of the circuit arrangement 10a can be practically programmed.

It is especially the response of the controller 18a that is provided programmable by it making use of control parameters saved in the individual registers of the second memory module 16a-2, these control parameters also being programmably variable to advantage by entering corresponding programming instructions and data (programming signal SP). Further control parameters saved in the registers for reprogramming relate to and tweak the response of the programming interface 20a. For example, programming may firstly involve activating one of the three bus links to the registers which is then stored as a certain control parameter in the programming signal SP for writing subsequent programming data into specific registers. In accordance with a defined programming protocol each register has a certain meaning for the response of the programming interface 20a or of the controller 18a.

Figure 3:
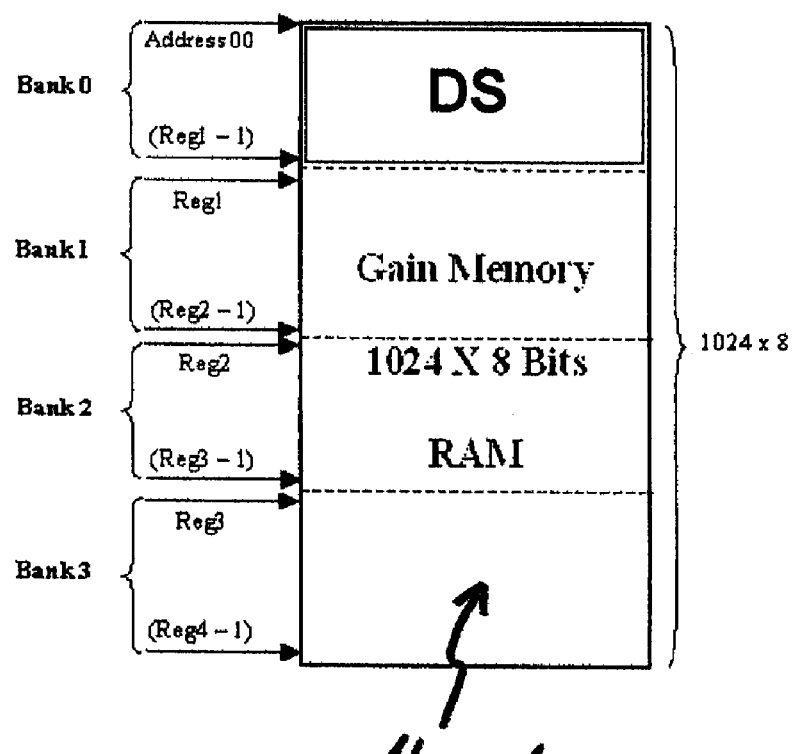
FIG. 3 is an illustration showing how a memory is logically divided into a plurality of memory banks.

Referring now to FIG. 3 there is illustrated how it is possible in the example as described to divide memory module 16a-1 logically into a plurality (in this case up to 4) memory banks each of which is provided to store a digital signal sequence DS.

The memory banks (identified bank0 to bank3 in FIG. 3) can be defined in number and size by corresponding control parameters. In the example as shown, the first memory bank (bank0) always commences at an address "00". The start and end of the further memory banks (bank1 to bank3) is defined, as shown in FIG. 3, by the control parameters "reg1" to "reg4". When the circuit arrangement 10 is in operation the response of the controller 18a in determining which of the memory banks and in what sequence is read out to generate the variable gain control signal SA is defined by further control parameters. In addition to this, control parameters are defined for each and every memory bank defining the rate and clock frequency at which reading out is done every time.

Referring now to FIG. 4 there is illustrated how the readout clock frequency can be programmed.

FIG. 4 is a Table in which the value of a control parameter defining the readout rate is entered in the fully left-hand column, in the example shown this value is a word 1 byte wide.

Entered in the second column of the Table is a "divider" provided for each value of the control parameter. This divider is entered as a setting for a frequency divider provided in the controller 18a, the frequency divider providing from a clock signal with a fundamental frequency of 40 MHz a corresponding frequency-divided clock signal which clocks the process of reading out the digital signal sequence DS. The third column in the Table as shown in FIG. 4 lists the resulting clock frequency. In conclusion, entered in the fully right-hand column is the resulting clock period.

In summary, the embodiments of a circuit arrangement 10 respectively 10a as described now makes it possible simply to digitally vary the gain of a VGA universally applicable and adaptable. By means of the digital interface in the circuit arrangement a defined signal pattern can be programmed which is saved in a memory for output to the VGA in accordance with likewise programmable control parameters for varying its gain. The output frequency of the digital sequence can be defined by the user. Preferably the memory can be divided into various banks, the user being able to define the content, size and readout frequency of each of these banks.

The main components of the system are the digital interface, a memory as well as a controller respectively a control logic.

By it having an integrated digital interface the circuit arrangement permits to advantage a digital communication with the system. One or more internal memory banks makes it possible to store one or more wanted sequences for varying the gain of the VGA and which in operation of the VGA can now be read out fast and at a precisely programmable frequency.

The invention claimed is:

1. An integrated circuit arrangement (10) for generating a digital variable gain control signal (SA) for a digitally variable gain amplifier (14), comprising:
   a memory (16) for storing at least one digital signal sequence (DS) defining a time gain profile,
   a controller (18) for generating the digital variable gain control signal (SA) by reading out the memory (16), and
   a digital programming interface (20) for programming the memory (16),
wherein the controller (18) is programmable, and wherein the controller (18) works by making use of control parameters stored in a storage area of the memory (16).

2. The integrated circuit arrangement (10) as set forth in claim 1, wherein the memory (16) comprises a first memory portion (16a-1) for storing at least one digital signal sequence (DS) and at least one second memory portion (16a-2) for storing control parameters of the controller (18) and/or of the programming interface (20).

3. The integrated circuit arrangement (10) as set forth in claim 1, wherein the memory (16) comprises a memory portion (16a-1) logically dividable into a plurality of banks for storing a plurality of digital signal sequences (DS).

4. An integrated circuit arrangement (10) for generating a digital variable gain control signal (SA) for a digitally variable gain amplifier (14), comprising:
   a memory (16) for storing at least one digital signal sequence (DS) defining a time gain profile,
   a controller (18) for generating the digital variable gain control signal (SA) by reading out the memory (16), and a digital programming interface (20) for programming the memory (16), wherein the controller (18) is programmable and works by making use of control parameters stored in the memory (16), wherein the memory (16) comprises a first memory portion (16*a*-1) for storing the at least one digital signal sequence (DS) and at least one second memory portion (16*a*-2) for storing control parameters of the controller (18) and of the programming interface (20).

5. The integrated circuit arrangement (10) as set forth in claim 4, wherein the function of the programming interface (20) is defined by control parameters which are also stored in the second memory portion (16*a*-2) and can be varied by means of inputting a programming signal (SP) into the programming interface (20).

6. The integrated circuit arrangement (10) as set forth in claim 4, wherein the first memory portion (16*a*-1) is logically dividable into a plurality of banks for storing a plurality of digital signal sequences (DS), wherein the number and size of these banks are defined by control parameters which are also stored in the second memory portion (16*a*-2).

7. The integrated circuit arrangement (10) as set forth in claim 4, wherein at least one of the control parameters is provided for defining a read out rate of the digital signal sequence (DS).

8. An amplifier system (1) comprising an integrated circuit arrangement (10) as set forth in claim 1 as well as a digitally variable gain amplifier (14).

9. An amplifier system (1) comprising an integrated circuit arrangement (10) as set forth in claim 4 as well as a digitally variable gain amplifier (14).

* * * * *